US007898147B2

(12) United States Patent
Grabinger et al.

(10) Patent No.: US 7,898,147 B2
(45) Date of Patent: Mar. 1, 2011

(54) WIRELESS ACTUATOR INTERFACE

(75) Inventors: Cory L. Grabinger, Maple Grove, MN (US); Mark D. Bokusky, Brooklyn Park, MN (US)

(73) Assignee: Honeywell International, Inc., Morristown, NJ (US)

(*) Notice: Subject to any disclaimer, the term of this patent is extended or adjusted under 35 U.S.C. 154(b) by 149 days.

(21) Appl. No.: 11/431,807

(22) Filed: May 10, 2006

(65) Prior Publication Data

US 2007/0262847 A1 Nov. 15, 2007

(51) Int. Cl.
*H01L 41/09* (2006.01)

(52) U.S. Cl. ........................................................ 310/317

(58) Field of Classification Search ................... 310/317
See application file for complete search history.

(56) References Cited

U.S. PATENT DOCUMENTS

2002/0050765 A1* 5/2002 Magnussen et al. ..... 310/323.16
2002/0183008 A1 12/2002 Menard
2006/0061233 A1* 3/2006 Ito et al. ........................ 310/317
2006/0082253 A1* 4/2006 Hara ............................ 310/317
2006/0197409 A1* 9/2006 Thiele .......................... 310/317
2006/0272710 A1* 12/2006 Minervini et al. ......... 137/487.5
2007/0080934 A1* 4/2007 Chen et al. .................... 345/156

* cited by examiner

*Primary Examiner* — Derek J Rosenau
(74) *Attorney, Agent, or Firm* — Hollingsworth & Funk, LLC

(57) ABSTRACT

An actuator includes a mechanical transducer component capable of applying a mechanical force to an external object in response to electronic signals. The actuator includes a communications interface capable of wirelessly receiving configuration data related to operation of the actuator. A settings module is coupled to the communications interface and capable of storing the configuration data. A controller unit is coupled to the mechanical transducer and the settings module. The controller unit is capable of determining the configuration data via the settings module and controlling the mechanical transducer in conformance with the configuration settings.

26 Claims, 8 Drawing Sheets

WIRELESS ACTUATOR INTERFACE

FIELD OF THE INVENTION

This invention relates in general to industrial controls, and in particular to electronically configurable actuators.

BACKGROUND

Actuators are widely used in all areas of mechanical design. Generally, actuators are transducers that transform an input signal into mechanical motion. Actuators may use any combination of electrical motors, pneumatic and hydraulic pistons, relays, comb drives, piezoelectric elements, thermal bimorphs, and similar devices to provide mechanical motion. An actuator may provide any combination of linear, curved, or rotary forces/motion.

Motors are commonly used in actuators when circular motions are needed, but can also be used for linear applications by transforming circular to linear motion, e.g., using screw drives. Other actuators may intrinsically linear, such as those using linear motors. Actuators may include a wide variety of mechanical elements to change the nature of the motion provided by the actuating/transducing element, including levers, ramps, screws, cams, crankshafts, gears, pulleys, constant-velocity joints, ratchets, etc.

Actuators may vary widely in size and power. Very large actuators may be used in applications such as dam gates or construction equipment. On the other end of the spectrum, actuators have been developed at micro- and nano-scales that may be used for such applications as robotics and medical technology. One technological area that commonly uses actuators is industrial controls, including specialty areas of heating, ventilation, and air conditioning (HVAC) and fire detection/suppression.

Modern actuators used in HVAC and fire/smoke systems are becoming increasingly sophisticated. The added functionality is due at least in part to the availability of inexpensive and powerful digital processing circuitry. For example, actuators may have electronic controlled and integrated auxiliary switches, multiple input selectable input modes, and adjustments for such settings as minimum/maximum travel, timing, speed, etc. At the same time, the actuator products themselves are shrinking in size due to concerns regarding ease of installation, weight, power consumption, performance, etc. As a result, it is becoming more difficult to allow such actuators to be easily accessed by people for setting up and changing built-in automatic features of the actuators. In addition, externally mounted controls (e.g., switches, potentiometers, etc.) are often difficult to access and see in many installations. Further, hard mounted controls are susceptible to environmental factors (e.g., dust, fluids, vibration) that can degrade these types of controls and thereby reduce reliability.

Therefore, a sophisticated yet user friendly way of providing control and setup of actuators is desirable. Such control provisions should allow such actuators to keep small form-factors, and reduce the degrading effects of the operational environment. The present invention fulfills these and other needs, and offers other advantages over the prior art.

SUMMARY

The present disclosure relates to actuators, in particular to electronically configurable actuators. In one embodiment of the invention, an actuator includes a mechanical transducer component capable of applying a mechanical force to an external object in response to electronic signals. The actuator includes a communications interface capable of wirelessly receiving configuration data related to operation of the actuator. A settings module is coupled to the communications interface and capable of storing the configuration data. A controller unit is coupled to the mechanical transducer and the settings module. The controller unit is capable of determining the configuration data via the settings module and controlling the mechanical transducer in conformance with the configuration settings.

In more particular embodiments, the communications interface is capable of wirelessly receiving control data used to change a physical configuration of the mechanical transducer and communicate the control data to the controller unit. The physical configuration of the mechanical transducer is changed by the controller unit in response to receipt of the control data. The actuator may include a sensing unit capable of detecting sensor data representing the changed physical configuration of the mechanical transducer. The sensing unit is coupled to communicate the sensor data to communications module, and the communications module wirelessly transmits the sensor data.

In other, more particular embodiments, the communications module is capable of determining the stored configuration data and wirelessly transmitting the configuration data. The configuration data may include travel limits of the actuation member, speed of the mechanical transducer, timing parameters of the mechanical transducer, and/or electrical input ranges of the actuator.

In another embodiment of the invention, a method of configuring an actuator involves coupling a wireless receiver to a data configuration interface of the actuator. Configuration data is prepared via a user interface device that is separate from the actuator. The configuration data is wireless transmitted from the user interface device to the wireless receiver of the actuator. The configuration data is applied to the actuator via data configuration circuitry of the actuator. The data configuration circuitry changes an operational parameter used during actuator operation in response to the applied configuration data.

In more particular embodiments, the method further involves preparing control data via the user interface, wirelessly transmitting the control data from the user interface device to the wireless receiver of the actuator, and applying the control data to control circuitry of the actuator. The control circuitry changes a physical configuration of the actuator at in response to the control data being applied to the control circuitry. The method may also involve detecting, via sensing circuitry of the actuator, status data that reflects the changed physical configuration of the actuator in response to application of the control data, wirelessly transmitting the status data to the user interface device via a wireless transmitter of the actuator, and displaying a representation of the status data to a user via the user interface device.

In other, more particular embodiments, the method further involves storing the configuration data in a memory of the actuator in response to applying the configuration data to the actuator via the data configuration interface. The stored configuration may be stored via the data configuration circuitry of the actuator, wirelessly to the user interface device via a wireless transmitter of the actuator, a representation of the configuration data displayed to a user via the user interface device.

In another embodiment of the invention, a system includes a wireless device and an actuator. The wireless device includes a user interface that allows a user to specify configuration data and a wireless data interface capable of transmitting the configuration data. The actuator is capable of being wirelessly exchanging data with the wireless device. The actuator includes a mechanical transducer capable of transmitting force to an external object in response to electronic signals, and a communications interface. The communications interface is capable of wirelessly receiving the configuration data from the wireless device. A settings module is coupled to the communications interface and capable of storing the configuration data. A controller unit is coupled to the mechanical transducer and the settings module, the controller unit capable of determining the configuration data via the settings module and controlling the mechanical transducer in conformance with the configuration settings.

In another embodiment of the invention, a system includes means for preparing configuration data via a user interface device, means for wirelessly transmitting the configuration data from the user interface device to a wireless receiver of an actuator, means for applying the configuration data to the actuator via data configuration circuitry of the actuator, and means for changing actuator operation in response to the applied configuration data.

In more particular embodiments, the system includes means for preparing control data via the user interface, means for wirelessly transmitting the control data from the user interface device to the wireless receiver of the actuator; and means for applying the control data to control circuitry of the actuator, wherein the control circuitry changes a physical configuration of the actuator at in response to the control data being applied to the control circuitry. The system may also include means for detecting, via sensing circuitry of the actuator, status data that reflects the changed physical configuration of the actuator in response to application of the control data, means for wirelessly transmitting the status data to the user interface device via a wireless transmitter of the actuator; and means for displaying a representation of the status data to a user via the user interface device.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described representative examples of systems, apparatuses, and methods in accordance with the invention.

BRIEF DESCRIPTION OF THE DRAWINGS

The invention is described in connection with the embodiments illustrated in the following diagrams.

DETAILED DESCRIPTION

Figure 1:
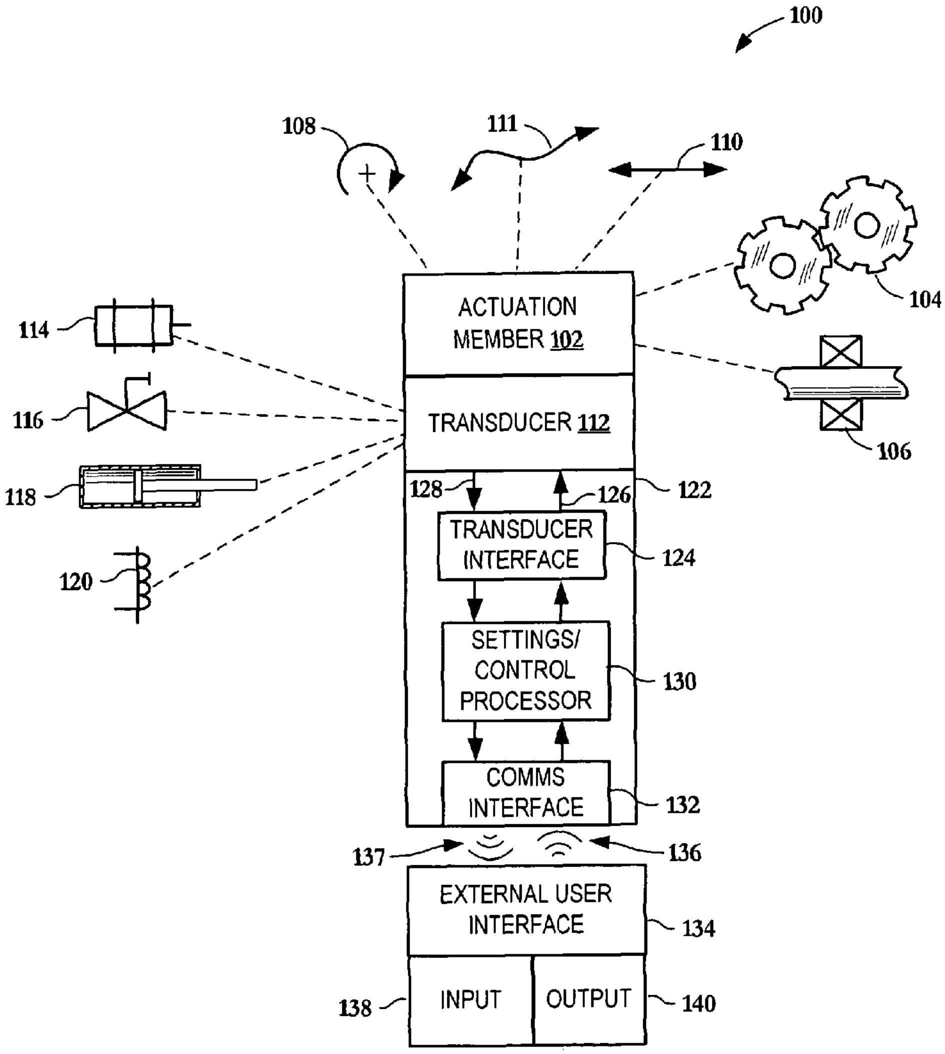
FIG. 1 is a block diagram illustrating components of an actuator according to embodiments of the invention.

In the following description of various exemplary embodiments, reference is made to the accompanying drawings that form a part hereof, and in which is shown by way of illustration various embodiments in which the invention may be practiced. It is to be understood that other embodiments may be utilized, as structural and operational changes may be made without departing from the scope of the present invention.

Generally, the present invention is directed to configuring and controlling actuators using an external user interface. The term "actuator," as used herein, includes any apparatus capable of providing forces and/or motion in response to an electrical control signal. Actuators may use any force transducer known in the art, including linear/rotary electrical motors, hydraulic or pneumatic pistons/motors, piezoelectric elements, etc. Electrical control signals may both actively control the actuator (e.g., movement commands) and be used to set system parameters (e.g., actuation limits, speeds). The electrical control signals may be generated internally, although at least a portion of the electrical signals originate from the external user interface. The external user interface may also be capable of operating in an interactive mode, such as to directly control the actuator, as well as in other capacities such as setting device parameters.

It will be appreciated that actuators described herein may not require any electrical control signal to cause the actuator to perform its basic functions (e.g., extend, retract, rotate), as these operations may be triggered in part by mechanical on non-electrical stimuli. However, some aspects of the actuator's operation will at least be indirectly affected by electrical control signals. For example, a hydraulic actuator may rely on a physical member to limit motion (e.g., a stop) that is adjusted by way of an electric motor. Thus, although the electrical motor may not be in operation when the actuator's motion is limited by the stop, the position of the stop was adjusted by way of electrical signals applied to the motor, thus signals to the motor indirectly control the behavior of the actuator.

Actuators as shown herein will generally have interfaces for accepting electrical signals at least for configuration of actuator parameters. The signals are provided at least in part by the external user interface. The external user interface generally includes a device that is physically separate from the actuator. In one embodiment, the external interface interacts with the actuator wirelessly. Use of a physically separate device for user interface enables the actuator to have sophisticated, flexible, and easy to understand controls, while still allowing the actuator to retain a small physical footprint and a utilize a mechanically simple exterior. Making the external interface wireless further simplifies the mechanical design, as no external connectors need be dealt with. Further, a wireless external interface is much easier to use when the actuator is mounted in a difficult to access location.

In reference now to FIG. 1, a block diagram illustrates components of an actuator 100 according to embodiments of the invention. The actuator 100 includes an actuation member 102 that is used to apply forces and/or moments to external objects. In the HVAC and fire detection/suppression fields, the actuation member 102 is used to move objects, such as dampers, valves, etc. The actuation member 102 often includes mechanical apparatus such as gears 104 and bearings 106 that provide the desired forces. Typically, the forces produced by the actuation member 102 are used to produce motion, such as rotation 108, linear translation 110, or specialized paths, as represented by curve 111. Those skilled in the art will appreciate that the actuator 100 need not always produce significant motion in operation. For example, the actuator 100 may be intended to exert a force or moment with little motion, such as in applying an opening/holding force to a door or other member.

The actuation member 102 is driven by a transducer 112. The transducer 112 generally transforms one form of energy to another. In actuator applications, at least some of the energy is transformed into a mechanical force by the transducer 112. Example transducers 112 may include electric motors 114, valves 116, pistons 118, and solenoids 120. It will be appreciated that the transducer 112 may be integrated with the actuation member 102, such as where a piston rod is the actuation member for a piston 118. Similarly, the transducer 112 may include many combinations of transducer components, such as a hydraulic piston 118 controlled by a solenoid-operated valve 116. Transducers 112 may be used for other purposes besides movement of the actuation member. For example, mechanical setting such as extension limits or gear ratios may be automatically adjusted by way of one or more transducers 112.

The actuator 100 includes provisions for controlling some aspects of its operation in response to electrical signals, as represented by the controller 122. The controller 122 is an electronic unit that may be used to at least control settings applied to the actuator 100, as well as for real-time control of the actuator 100. The electrical signals are applied to the transducer 112, either directly or indirectly, via a transducer interface 124. The transducer interface 124 may include circuitry for amplifying and conditioning of signals 126 that are applied to electrical control portions of the transducer 112. The transducer interface 112 may also include circuitry for receiving signals 128 generated by the transducers 112 and processing those signals 128 for use by other components of the controller 122. An example of these latter signals 128 includes outputs of sensors that may be included or separate from the transducer 112.

The controller 122 also may include a settings/control processor 130 that manages data on behalf of the actuator 100. The settings/control processor 130 is coupled to the transducer interface 124 for sending and receiving transducer data. The settings/control processor 130 may also be coupled to a communications interface 132 that enables remote configuration and/or control of the actuator 100. The settings/control processor 130 may include any combination of analog and digital circuitry. In one embodiment, the processor 130 may be provided as a custom digital state machine or a general purpose microprocessor. The processor 130 may include or have access to memory (not shown) for storing and retrieving data related to actuator operation.

The communications interface 132 allows an external device, such as an external user interface 134, to affect the settings/control processor 130. Although the communications interface 132 may use solid media such as wire or optical fiber to communicate with external devices 134, the illustrated interface 132 includes the ability to communicate wirelessly, as indicated by signals 136, 137. The wireless interface 132 typically includes receiver circuitry for receiving and processing incoming signals 136, and may also include transmitting circuitry for transmitting signals 137.

Generally, the communications interface 132 allows the external user interface 134 (and similar devices) to apply configurations, query existing settings, query operational data (e.g., cycle counters, sensor data including position, force, temperature, etc), control the actuator, run self tests, etc. The communications interface 132 and user interface 134 may engage in one-way or two-way communications. Typically, the interfaces 132, 134 will at least support a transmission from the user interface 134 to the actuator 100. However, in order to confirm that configuration changes and other communications were successful, a transmission from the actuator 100 (via the communications interface 132) to the user interface device 134 is desirable.

The wireless signals 136, 137 may include any wireless communication medium known in the art, including radio, light, and sound transmissions. The signals 136, 137 may operate at a single transmission frequency, or at multiple transmission frequencies, including the use of spread spectrum transmission technologies. The signals 136, 137 may be encoded with any type of modulation, including amplitude, frequency, and phase shift. The transmission media type of signals 136, 137 and are chosen based on factors generally known in the art, including cost, installation requirements (e.g., whether line-of-sight with communications interface is available), bandwidth, existence of interference, power consumption, etc.

The external user interface 134 includes one or more wireless interfaces compatible with the communications interface 132 of the actuator 100. The external user interface 134 may be implemented using a general purpose device, such as a portable computer, PDS, cellular phone, etc. Such a device may be programmable for any number of different actuators 100, and similar devices. The external interface 134 may also include custom designed hardware that is compatible with a particular actuator 100 or set of actuators.

The external user interface 134 generally includes a human-machine interface that includes input devices 138 and output devices 140. Input device 138 are used to accept user input for such purposes as applying actuator settings, actuator control, menu navigation, setup of the interface device 134, etc. Input devices 138 may include devices such as buttons, keypads, dials, wheels, motion sensors, voice recognition, etc. The output device 140 shows the results of user inputs, actuator status, current actuator settings, settings/status of the interface device 134, etc. The output device 140 may include video displays, alphanumeric displays, light emitting diodes (LEDs), liquid crystal displays (LCDs), speakers, tactile feedback devices, etc.

Figure 2:
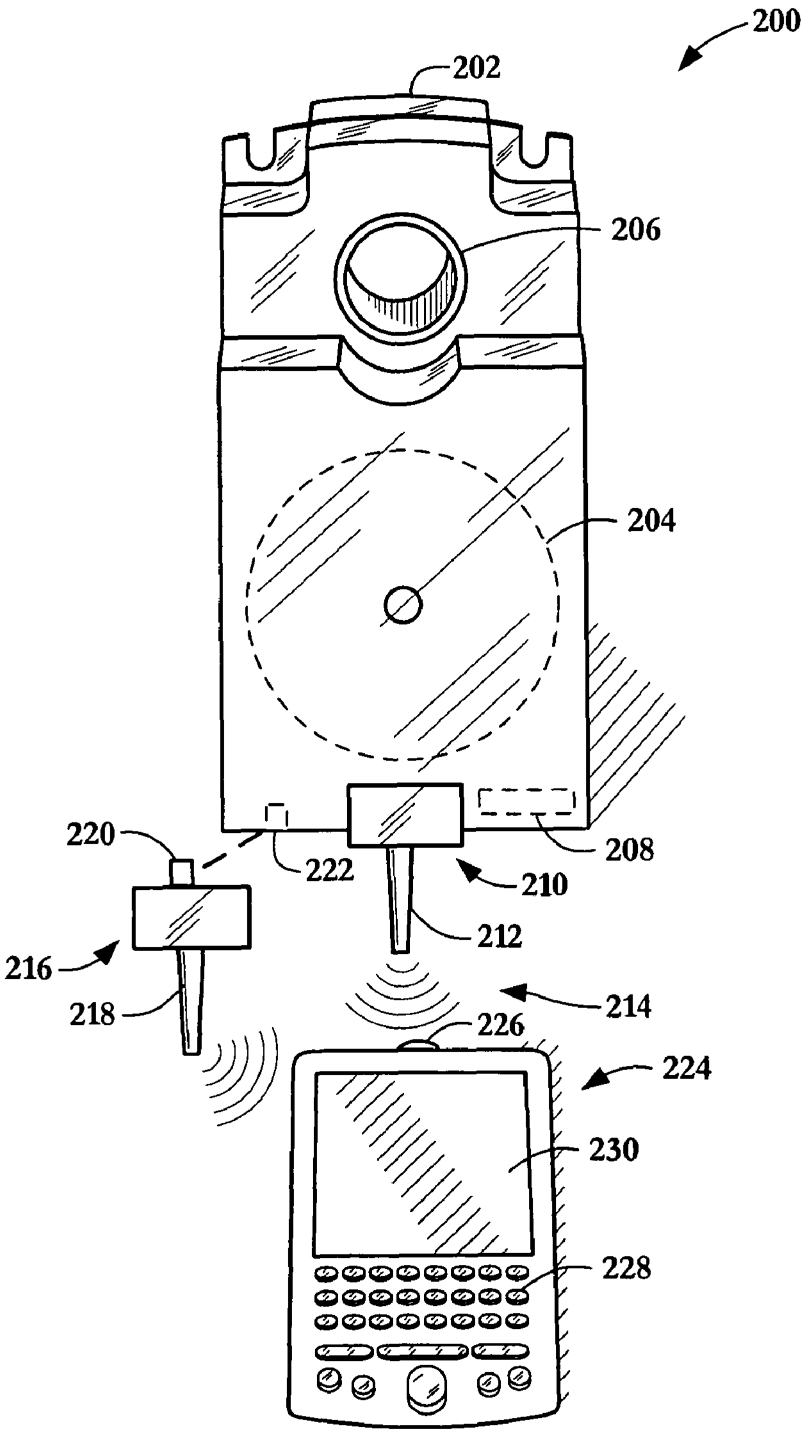
FIG. 2 is a perspective view of an example actuator system according to embodiments of the invention.

A more particular example of an actuator system 200 according to an embodiment of the invention shown in the perspective view of FIG. 2. The example system 200 includes a rotary actuator 202 driven by an electric motor 204. A rotary coupling 206 is driven by the electric motor 204, either directly or by intermediate apparatus such as gears, pulleys, or wheels (not shown). The rotary coupling 206 acts as an actuation member that may be coupled to a shaft or other member for purposes of automated control.

The electric motor 204 of the actuator 202 is electrically coupled to control circuitry 208, which includes an electrical interface (e.g., amplifiers, buffers), control circuitry (e.g., digital logic) and power circuitry. The control circuitry 208 may include one or more printed circuit cards, as well as off-card components, such as limit switches, sensors, etc. The control circuitry 208 also includes the capability to access and apply various settings associated with the motor 204 and circuitry 208. These settings may be stored using any mechanical or electrical mechanism known in the art. For example, where the settings affect an adjustable mechanical component, the settings may be determined by sensing the current configuration or state of the component. More commonly, however, the circuitry 208 includes some sort of non-volatile digital memory (e.g., flash memory) that allows various operational parameters to be stored such that the data is not lost if power is removed.

The control circuitry 208 may include a default or failsafe set of parameters that govern the operation of the actuator 202 in the absence of any user settings. However, the end-user will often want to modify settings, either before or after the actuator is installed. To allow a convenient adjustment of the actuator 202, a wireless interface 210 is coupled to control circuitry 208. The wireless interface 210 includes an antenna/receptor 212 that allows signals 214 to be sent and received for purposes of affecting operation of the control circuitry 208.

The illustrated wireless interface 210 is fixed to the housing of the actuator 202. However, it may be advantageous to alternately provide a removable wireless interface, such as removable interface 216. The removable interface 216 may include similar components as the fixed interface 210, including a wireless antenna/receptor 218. The removable interface 216 also includes a connector 220 that mates with a matching receptacle 222 on the actuator 200. The connector 220 and/or receptacle 222 may also include structural members, such as fasteners, clips, threads, etc., that allows the interface 216 to be fixably coupled to the actuator 202. In other arrangements, the removable wireless interface 216 may be coupled to the receptacle 222 via a cable (not shown) that allows the interface 216 to be mounted distantly from the actuator 202. Such an arrangement may be advantageous in some situations, such as where the actuator 200 is mounted in an enclosure that is impermeable to light or radio waves.

Regardless of whether the actuator 202 includes a fixed wireless interface 210 and/or a removable interface 216, the end user may utilize a user interface device 224 in order to configure the control circuitry 208 via one or both of the wireless interfaces 210, 216. The illustrated user interface device 224 is a standard portable processing device, such as a PDA or ultra-mobile personal computer (PC). The interface device 224 includes an antenna/receptor 226 compatible with the wireless interface(s) 210, 216 of the actuator 200. The user interface device 224 includes buttons 228 for accepting user input, and a display 230 for presenting user output.

Figure 3A:
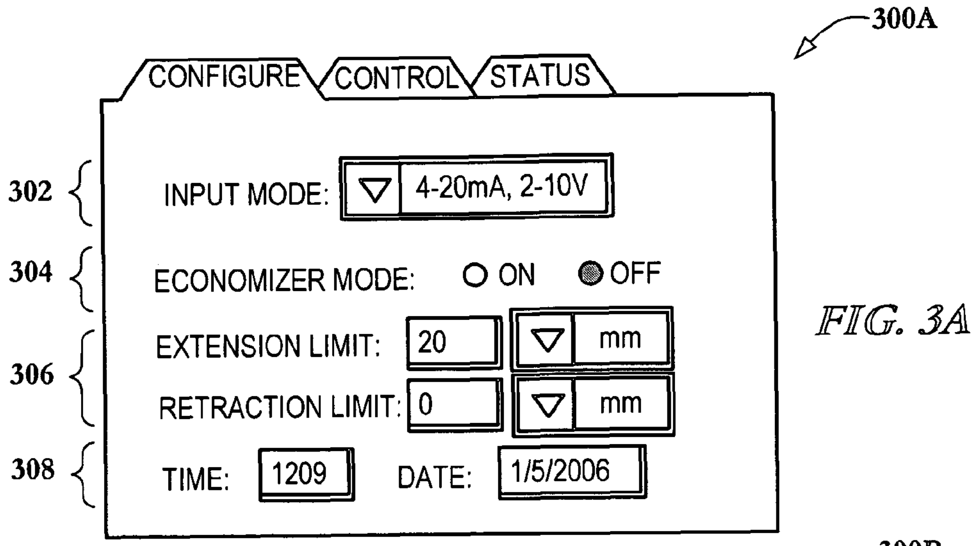
FIGS. 3A-C are diagrams of user interface components that may be used to access data related to various aspects of actuator operation according to embodiments of the invention.
Figure 3B:
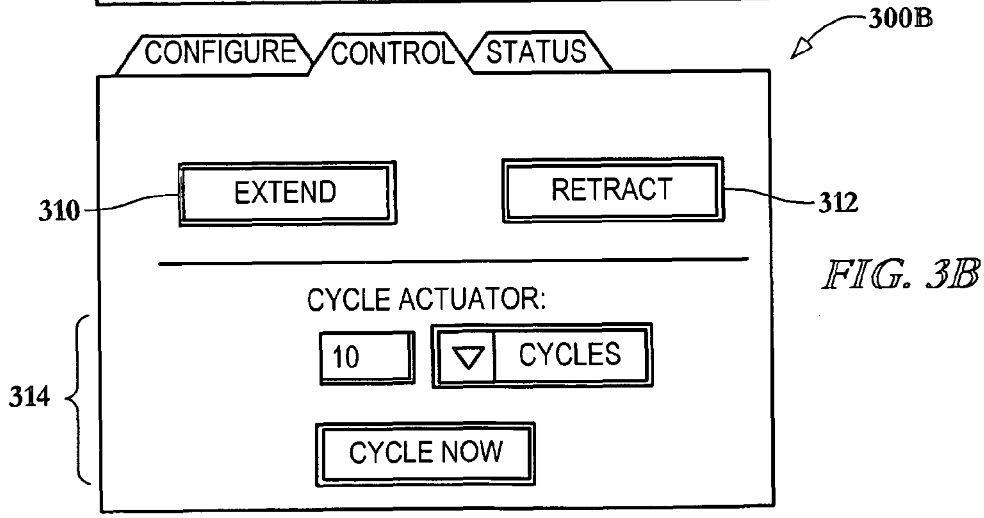
Figure 3C:
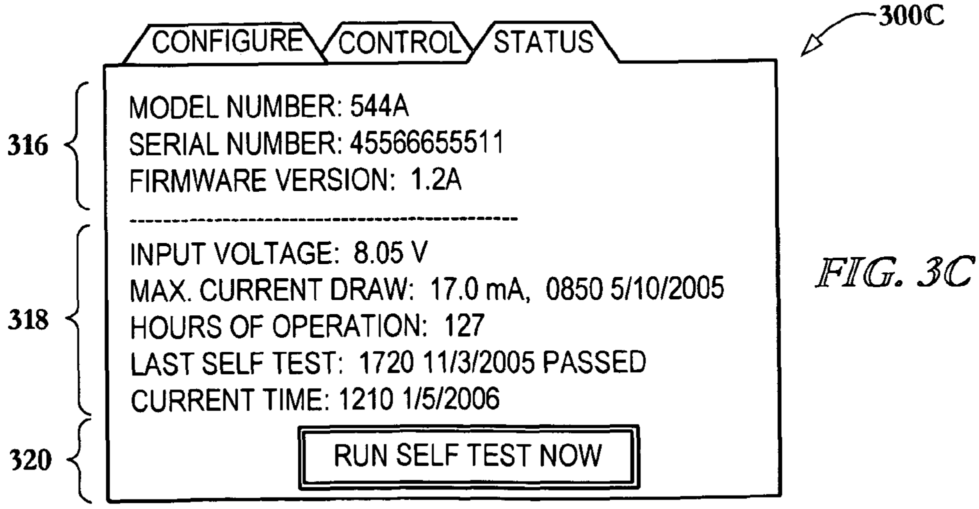

A user interface device 224 may use a variety of user input and output arrangements. General purpose computing devices such as the illustrated device 224 allow a graphical user interface (GUI) to be inexpensively implemented. A GUI can be user friendly, yet still capable of providing sophisticated and flexible access to the underlying configurations and operations of the actuator system 200. Example embodiments of actuator configuration GUIs 300A-C according to embodiments of the invention are shown in FIGS. 3A-C.

The GUIs 300A-C represent various panels of a tabbed interface that may be used to access data related to various aspects of actuator operation. Panel 300A illustrates an exemplary configuration interface, panel 300B illustrates an exemplary control interface, and panel 300C illustrates an exemplary status/test panel. The configuration interface 300A includes controls for setting actuator parameters such as voltage/current input mode 302, economizer mode 304, extension/retraction limits 306, time/date 308.

The controls panel 300B provides controls for such real-time, active actuator control, such as extension/retraction buttons 310, 312 and controls 314 that enable the running of multiple extension/retraction cycles. The status/test panel 300C includes relatively static configuration data 316 such as model number, serial number, and firmware/software version. Operational status data 318 may also be shown in the status/test panel 300C, which may show such data as input voltage, historical data (e.g., maximum current usage, run time, self tests), current date/time, etc. The status/test panel 300C may also allow the user to run actuator self tests, as represented by button 320. Those skilled in the art will appreciated that the example GUIs 300A, 300B, 300C are exemplary, the selection, arrangement, and type of controls within a configuration GUI, as well as underlying content can vary from those illustrated. For example, similar functionality may be provided using a text-based menu on a dot-matrix LED or LCD text display.

Figure 4:
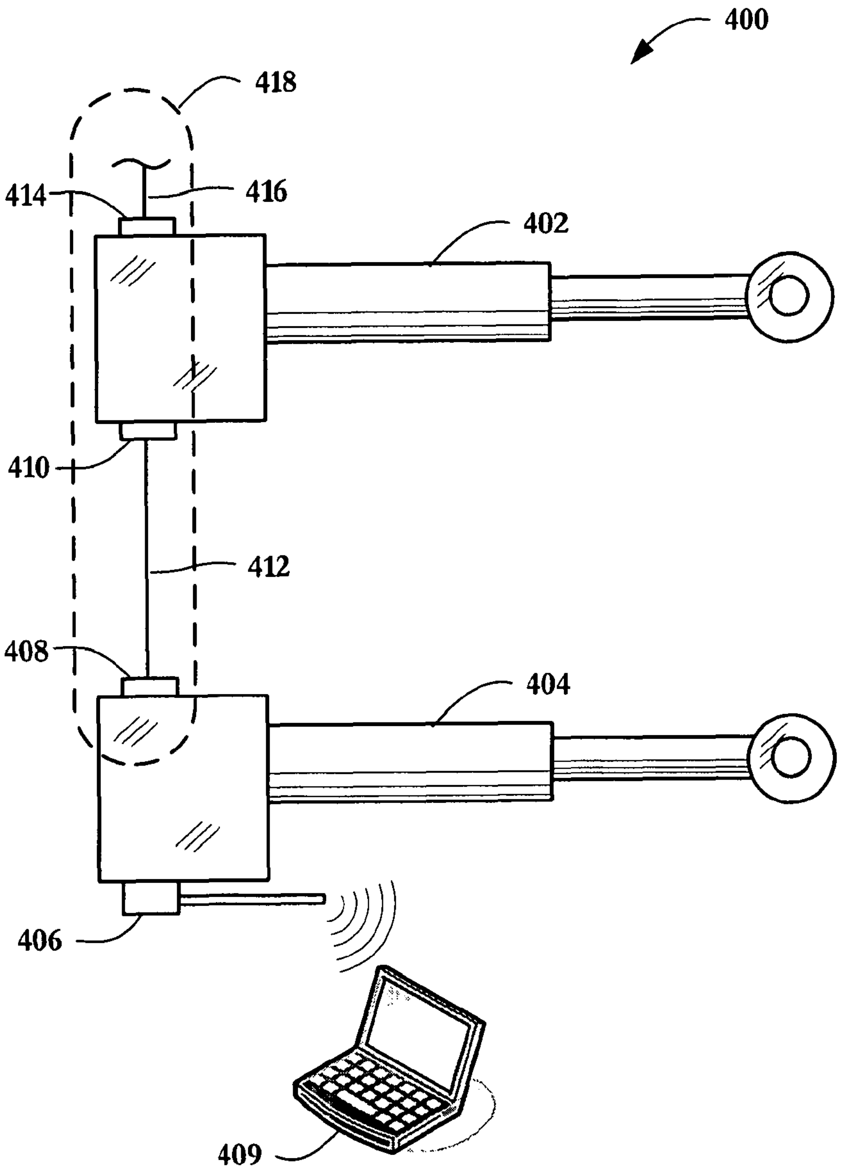
FIG. 4 is a diagram of a multi-actuator arrangement according to embodiments of the invention.

In the illustrated embodiments above, a wireless interface is used to set and receive configuration data relating to a single actuator. In multi-actuator systems, each actuator may have a separate integral or plug-in wireless adapter, each separately accessible and addressable from a wireless user interface device. An alternate multi-actuator arrangement 400 according to an embodiment of the invention is shown in FIG. 4. The illustrated arrangement includes two independently operable linear actuators 402 and 404. The actuator 404 includes a wireless adapter 406 that is accessible from a wireless user interface device, here represented by laptop computer 408. The actuator 404 also includes a wired interface 408 that is capable of being coupled to a wired interface 410 of actuator 402 via a cable 412. Actuator 402 also includes another wired interface 414 capable of being coupled to another actuator (not shown) via cable 416, and so on.

Generally, the wired interfaces 408, 410, 414 and cables 412, 416 can form a wired data bus 418 capable of managing a plurality of actuators, as well as other control devices. For example, the bus 418 could interface with devices such as switches, sensors, thermostats, controls, smoke detectors, temperature sensors, etc. The wireless interface 406 is also coupled to the wired bus 418, thereby allowing access to a large number of components via a conveniently accessible wireless device 409. The bus 418 could communicate via dedicated signal wires, or "piggyback" data on top of other conductive paths, such as power wires.

Figure 5:
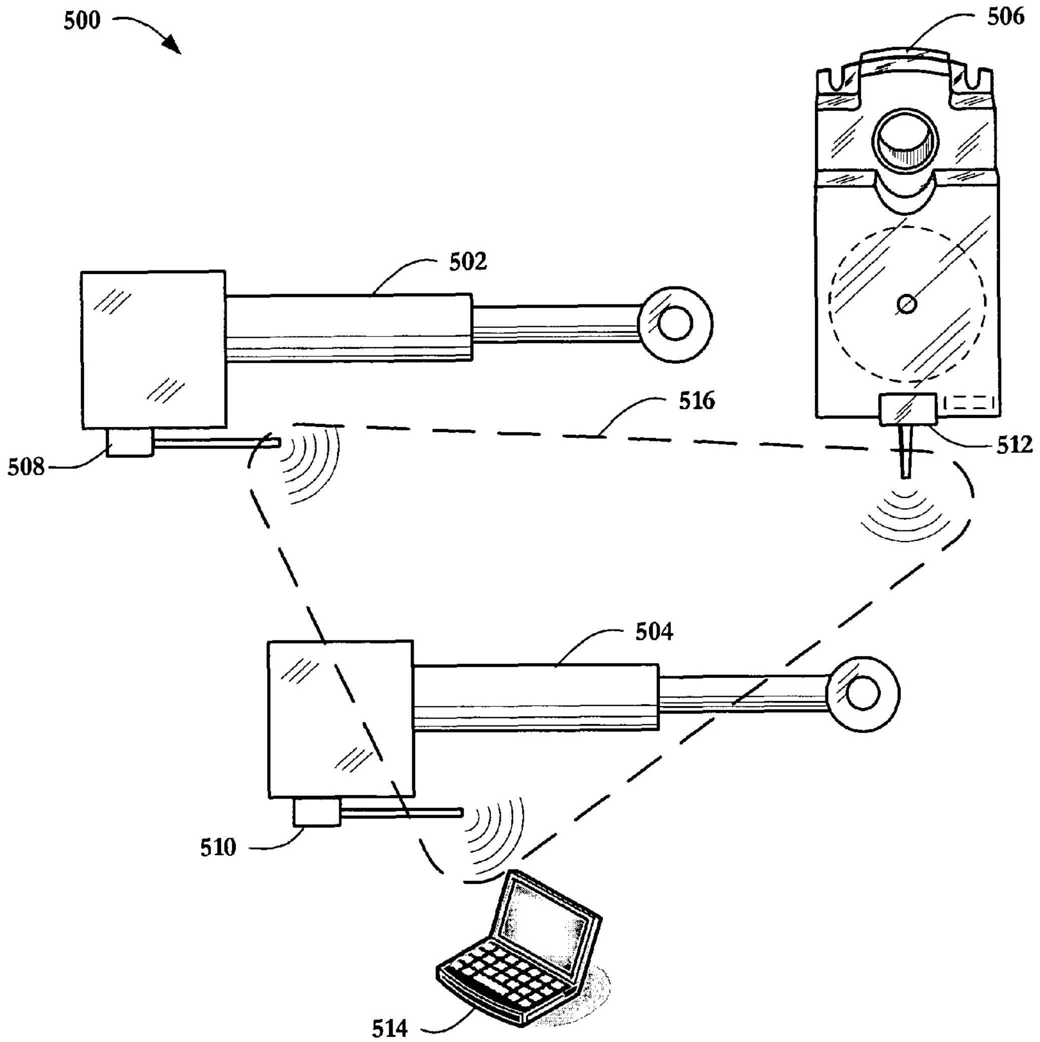
FIG. 5 is a diagram of an alternate multi-actuator arrangement according to embodiments of the invention.

The bus 418 in FIG. 4 utilizes conductors to share data between multiple devices for single access via a wireless user interface device. In some situations, it may be desirable to allow wireless devices to be similarly coupled onto a common, logical network that may only need a single point of entry. An arrangement 500 that uses a wireless network according to an embodiment of the invention is shown in FIG. 5. In this arrangement, three actuators, Linear actuators 502, 504 and rotary actuator 506, each include respective wireless interfaces 508, 510, 512. A wireless user interface device 514 is wirelessly coupled to at least one of the actuator wireless interfaces 508, 510, 512. The actuators 502, 504, 506 may interact to form a relay or mesh network, wherein at least some of the actuators 502, 504, 506, pass data on behalf of others of the actuators 502, 504, 506. Wireless mesh networks are designed to handle many-to-many connections between wireless nodes and are capable of dynamically altering the connections as needed. As a result, mesh networks can use distributed devices to provide long range, self-healing data paths to the nodes of the network, and offer other advantages over traditional point-to-point or broadcast wireless connections.

In the illustrated embodiments, the wireless technologies included with actuators may include standard or proprietary short range data transfer protocols. Examples of such protocols include Bluetooth, IrDA, IEEE 802.11 wireless local area networks (WLAN), HomeRF, etc. These technologies generally utilize low power, close range or line of sight wireless transmissions. In alternate arrangements, however, an actuator according to embodiments of the invention may use long range wireless technologies, as exemplified by cellular network providers and mobile digital service providers. A long-range wireless solution can provide configuration and setup of actuators and related equipment from nearly anywhere.

Figure 6:
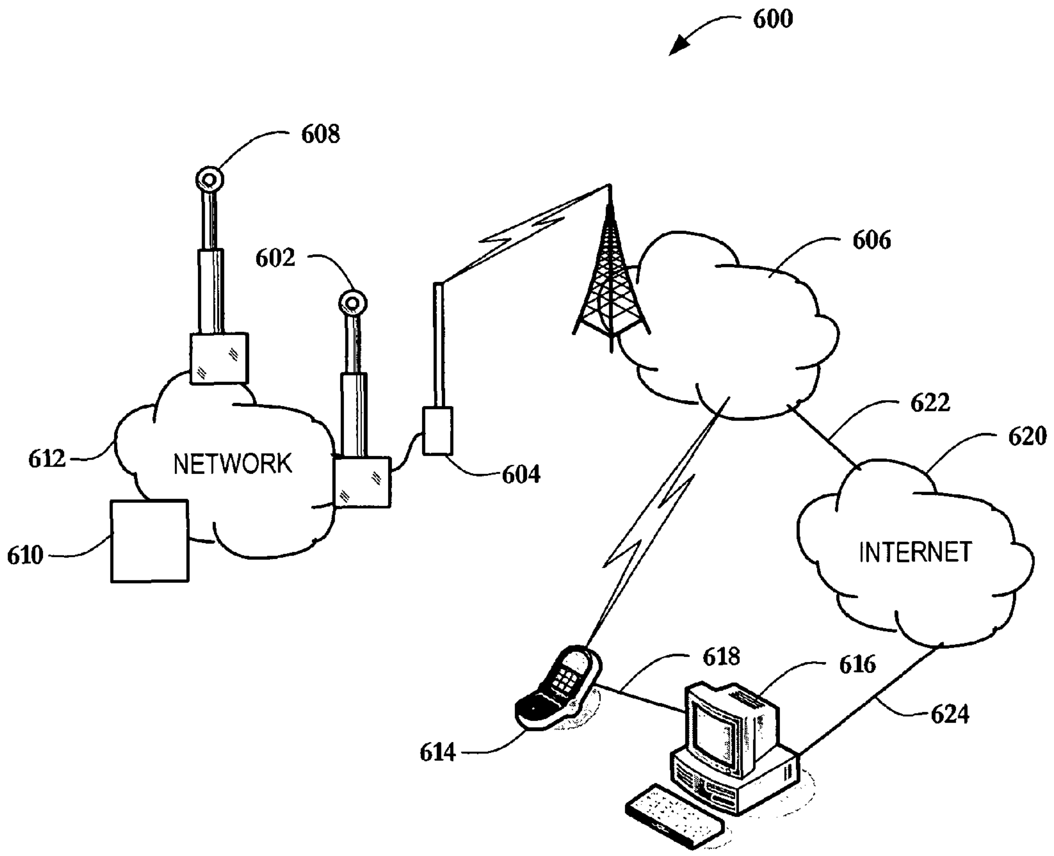
FIG. 6 is a diagram of a long-range wireless actuator system according to embodiments of the invention.

In reference now to FIG. 6, a long-range wireless actuator system 600 according to embodiments of the invention is illustrated. The system 600 includes at least one actuator 602 that includes a long range wireless interface 604. This interface 604 may utilize digital or analog transmissions, and generally relies on a wireless infrastructure for support, as represented by wireless provider network 606. The wireless interface 604 may be physically attached to the actuator 602, or may be physically separate and coupled via a cable or other transmission media.

The actuator 602 may be a standalone device, or may be connected to other actuators 608 and other devices 610 by a common bus or network 612. The long range wireless interface 604 may provide remote access to any device 602, 608, 610 coupled by the bus or network 612. A user interface may be provided in a device that utilizes the provider network 606 directly, such as a cellular phone 614 or PDA (not shown). In another arrangement, the cellular phone 614 may act as a communication interface between the provider network 606 and another device, such as personal computer 616, as indicated by path 618. In an alternate arrangement, the provider network 606 may be coupled to the Internet 620 (or other large scale network), thus allowing the computer 616 to access the actuator configuration(s) directly, as indicated by paths 622, 624.

Figure 7:
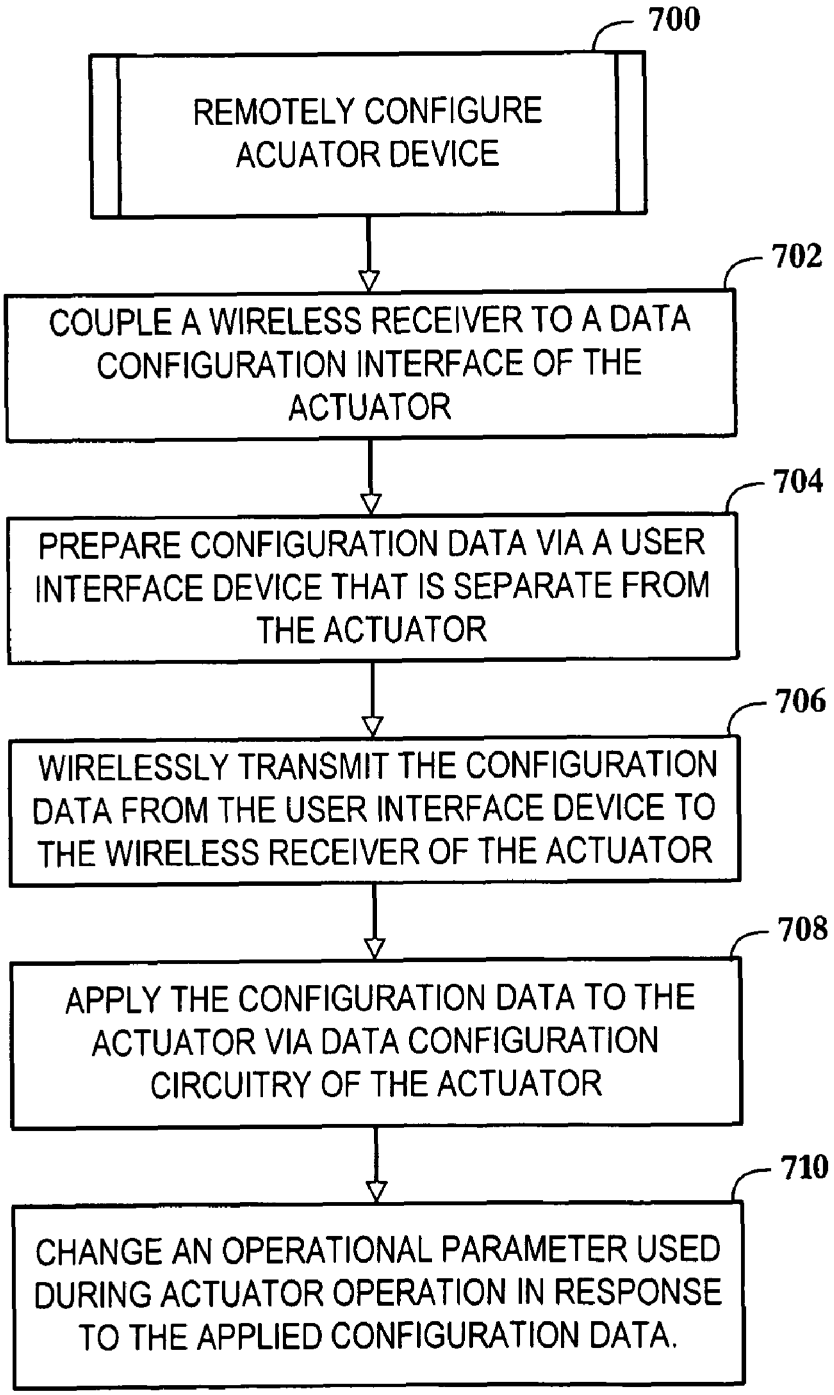
FIG. 7 is a flowchart illustrating a procedure for remotely configuring an actuator according to embodiments of the present invention.

In reference now to FIG. 7, a flowchart illustrates a procedure 700 for remotely configuring an actuator according to embodiments of the present invention. A wireless receiver is coupled 702 to a data configuration interface of an actuator. Configuration data is prepared 704 via a user interface device that is separate from the actuator. The configuration data is wirelessly transmitted 706 from the user interface device to the wireless receiver of the actuator. The configuration data is applied 708 to the actuator via data configuration circuitry of the actuator. The data configuration circuitry changes 710 an operational parameter used during actuator operation in response to the applied configuration data.

Figure 8:
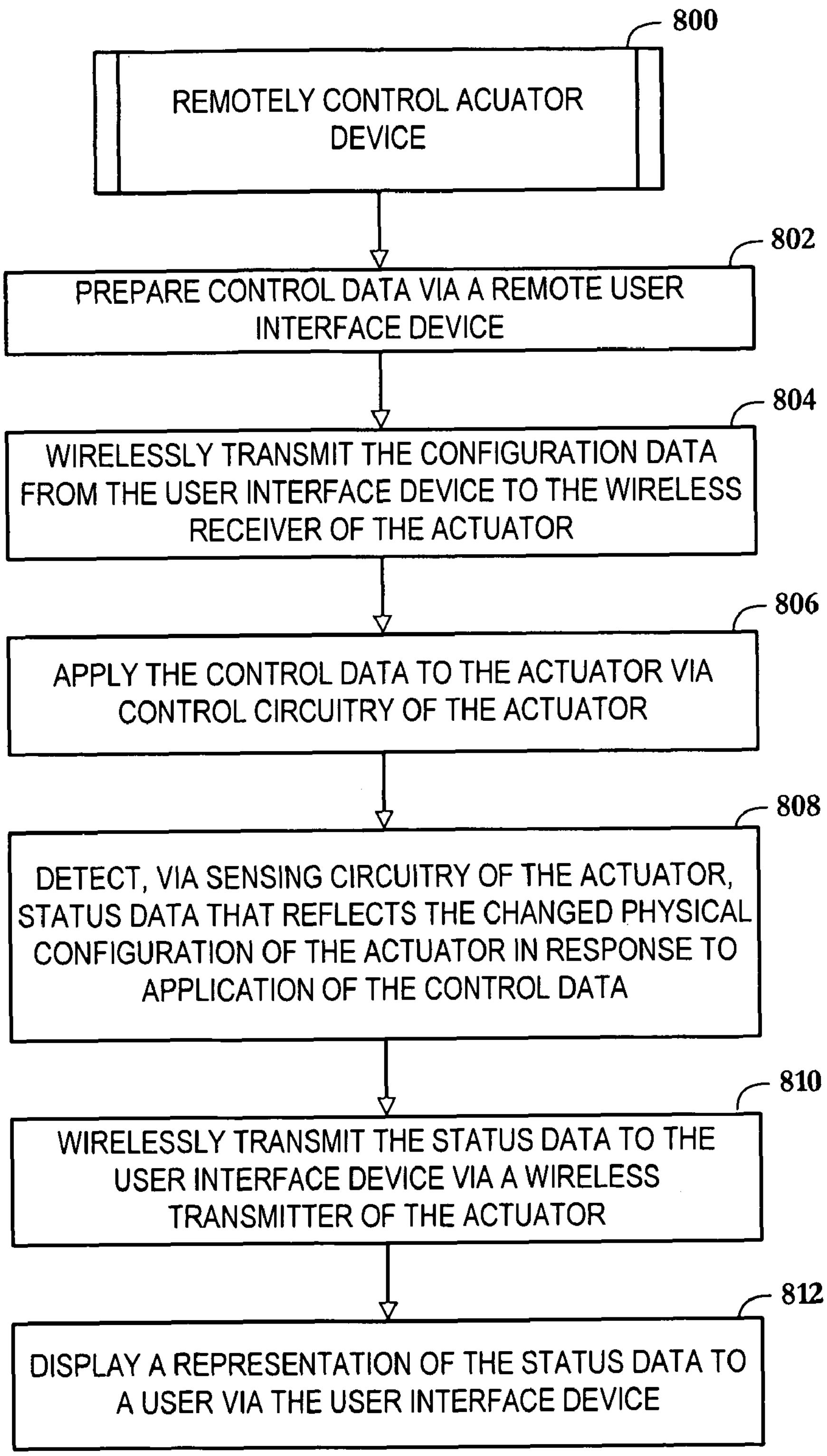
FIG. 8 is a flowchart illustrating a procedure for remotely controlling an actuator according to embodiments of the present invention.

In reference now to FIG. 8, a flowchart illustrates a procedure 800 for remotely controlling an actuator according to embodiments of the present invention. Control data is prepared 802 via a user interface device. The control data is wirelessly transmitted 804 from the user interface device to a wireless receiver of the actuator. The control data is applied 806 to control circuitry of the actuator. The control circuitry changes a physical configuration of the actuator at substantially the same time as the control data is applied to the control circuitry. Sensing circuitry of the actuator may detect 808 status data that reflects the changed physical configuration of the actuator in response to application of the control data. The status data is wirelessly transmitted 810 to the user interface device via a wireless transmitter of the actuator. A representation of the status data is displayed 812 to a user via the user interface device.

Hardware, firmware, software or a combination thereof may be used to perform the various functions and operations described herein for controlling actuator hardware. Articles of manufacture encompassing code to carry out functions associated with the present invention are intended to encompass a computer program that exists permanently or temporarily on any computer-usable medium or in any transmitting medium which transmits such a program. Transmitting mediums include, but are not limited to, transmissions via wireless/radio wave communication networks, the Internet, intranets, telephone/modem-based network communication, hard-wired/cabled communication network, satellite communication, and other stationary or mobile network systems/communication links. From the description provided herein, those skilled in the art will be readily able to combine software created as described with appropriate general purpose or special purpose computer hardware to create a system, apparatus, and method in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather determined by the claims appended hereto.

What is claimed is:

1. An actuator, comprising:

a mechanical transducer component capable of applying a mechanical force to an external object in response to electronic signals;

a wireless communications interface including at least a wireless receiver capable of wirelessly receiving data related to operation of the actuator and to operation of one or more external devices that are distinct from both the actuator and an entity originating the data;

a settings module coupled to the wireless communications interface and capable of storing the data;

a wired interface coupled to the wireless communications interface and capable of wired bus communications with the one or more external devices via a wired bus, wherein the wired interface is capable of managing the one or more external devices in response to the data received wirelessly via the wireless communications interface; and a controller unit coupled to the mechanical transducer and the settings module, the controller unit configured to control the mechanical transducer in conformance with the stored data.

2. The actuator of claim 1, wherein the wireless communications interface is capable of wirelessly receiving control data used to change a physical configuration of the mechanical transducer and communicate the control data to the controller unit, wherein the physical configuration of the mechanical transducer is changed by the controller unit in response to receipt of the control data.

3. The actuator of claim 2, further comprising a sensing unit capable of detecting sensor data representing the changed physical configuration of the mechanical transducer, wherein the sensing unit is coupled to communicate the sensor data to the wireless communications interface, wherein the wireless communications interface wirelessly transmits the sensor data.

4. The actuator of claim 1, wherein the wherein the wireless communications interface is capable of determining the stored data and wirelessly transmitting the data.

5. The actuator of claim 1, wherein the data includes travel limits of the mechanical transducer component.

6. The actuator of claim 1, wherein the data include speed of the mechanical transducer.

7. The actuator of claim 1, wherein the data include timing parameters of the mechanical transducer.

8. The actuator of claim 1, wherein the data include electrical input ranges of the actuator.

9. The actuator of claim 1, wherein the wired bus comprises a power bus.

10. The actuator of claim 1, wherein the one or more external devices comprise devices operating in one of a group comprising heating, ventilation, and air conditioning (HVAC), and fire detection/suppression.

11. The actuator of claim 1, wherein the one or more external devices comprise one or more other actuators.

12. The actuator of claim 1, wherein the one or more external devices comprise one or more sensors.

13. The actuator of claim 1, wherein the communications interface comprises a long-range wireless interface.

14. The actuator of claim 13, wherein the long-range wireless interface comprises a wireless telephony interface.

15. The actuator of claim 1, wherein the communications interface comprises a removable wireless receiving portion, wherein the removable wireless receiving portion is mountable distantly from the actuator to improve reception of wireless signals.

16. A system, comprising:

a wireless device comprising, a user interface that allows a user to specify configuration data; and a wireless data interface capable of transmitting the configuration data; and an actuator capable of wirelessly exchanging data with the wireless device, the actuator comprising, a mechanical transducer capable of transmitting force to an external object in response to electronic signals;

a wireless communications interface including at least a wireless receiver, the communications interface capable of wirelessly receiving from the wireless device the configuration data related to operation of both the actuator and one or more external devices that are distinct from the actuator and that are distinct from the wireless device;

a settings module coupled to the wireless communications interface and capable of storing the configuration data;

a wired interface coupled to the wireless communications interface and capable of wired bus communication with the one or more external devices via a wired bus, wherein the wired interface is capable of managing the one or more external devices in response to configuration data received wirelessly from the wireless device; and a controller unit coupled to the mechanical transducer and the settings module, the controller unit configured to control the mechanical transducer in conformance with the configuration data.

17. The system of claim 16, wherein the communications interface of the actuator is capable of wirelessly receiving control data from the wireless device, the control data used to change a physical configuration of the mechanical transducer, wherein the communications interface communicates the control data to the controller unit, and wherein the physical configuration of the mechanical transducer is changed by the controller unit in response to receipt of the control data.

18. The system of claim 17, wherein the actuator further comprises a sensing unit capable of detecting sensor data representing the changed physical configuration of the mechanical transducer, wherein the sensing unit is coupled to communicate the sensor data to communications module, wherein the communications interface wirelessly transmits the sensor data to the wireless device for purposes of representing the sensor data to the user.

19. The system of claim 16, wherein the configuration data include travel limits of the mechanical transducer.

20. The system of claim 16, wherein the configuration data include speed of the mechanical transducer.

21. The system of claim 16, wherein the configuration data include timing parameters of the mechanical transducer.

22. The system of claim 16, wherein the configuration data include electrical input ranges of the actuator.

23. A system comprising:

means for preparing configuration data related to an actuator, and to one or more external devices distinct from the actuator, via a user interface device;

means for wirelessly transmitting the configuration data and the secondary configuration data from the user interface device to a wireless receiver of the actuator;

means for applying at least some of the configuration data to the actuator via data configuration circuitry of the actuator;

means for changing actuator operation in response to the applied configuration data;

means for communicating at least some of the configuration data to the one or more external devices via a wired bus and by way of the actuator for managing the one or more external devices, in response to wirelessly receiving the configuration data, wherein the one or more external devices are distinct from the actuator, the means for preparing the configuration data, and the means for wirelessly transmitting the configuration data.

24. The system of claim 23, further comprising:

means for preparing control data via the user interface;

means for wirelessly transmitting the control data from the user interface device to the wireless receiver of the actuator; and means for applying the control data to control circuitry of the actuator, wherein the control circuitry changes a physical configuration of the actuator at in response to the control data being applied to the control circuitry.

25. The system of claim 24, further comprising:

means for detecting, via sensing circuitry of the actuator, status data that reflects the changed physical configuration of the actuator in response to application of the control data;

means for wirelessly transmitting the status data to the user interface device via a wireless transmitter of the actuator; and means for displaying a representation of the status data to a user via the user interface device.

26. A method comprising:

wirelessly receiving, at an actuator, configuration data related to operation of the actuator and related to operation of one or more external devices that are distinct from the actuator and that are distinct from an entity originating the configuration data, wherein the one or more external devices are coupled via a wired bus to a wired interface of the actuator;

storing the configuration data at the actuator;

controlling a mechanical transducer in conformance with at least some of the configuration data, wherein the mechanical transducer component is capable of applying a mechanical force to an external object in response to electronic signals; and managing the one or more external devices via the wired bus in response to at least some of the configuration data received wirelessly via the communications interface.

* * * * *